US008513667B2

(12) United States Patent
Jung et al.

(10) Patent No.: US 8,513,667 B2
(45) Date of Patent: Aug. 20, 2013

(54) THIN FILM TRANSISTOR ARRAY PANEL AND MANUFACTURING METHOD THEREOF

(75) Inventors: Sang-Hun Jung, Icheon-si (KR); Dong Wuuk Seo, Asan-si (KR); Gwang-Bum Ko, Asan-si (KR); Sun-Jung Lee, Asan-si (KR)

(73) Assignee: Samsung Display Co., Ltd., Yongin (KR)

( * ) Notice: Subject to any disclaimer, the term of this patent is extended or adjusted under 35 U.S.C. 154(b) by 6 days.

(21) Appl. No.: 13/310,078

(22) Filed: Dec. 2, 2011

(65) Prior Publication Data
US 2012/0199835 A1 Aug. 9, 2012

(30) Foreign Application Priority Data

Feb. 7, 2011 (KR) .................. 10-2011-0010743

(51) Int. Cl.
*H01L 29/10* (2006.01)
*H01L 21/00* (2006.01)
(52) U.S. Cl.
USPC .. 257/59; 257/72; 257/E33.053; 257/E21.19; 438/34
(58) Field of Classification Search
CPC ... H01L 27/1214; H01L 27/12; H01L 27/153; H01L 29/66757; G02F 1/136227
USPC .......... 257/59, 72, E33.053, E21.19; 438/22, 438/28, 34, 585
See application file for complete search history.

(56) References Cited

U.S. PATENT DOCUMENTS

2008/0180400 A1* 7/2008 Kim et al. ............... 345/173
2009/0224257 A1* 9/2009 Chin et al. ............... 257/72

* cited by examiner

*Primary Examiner* — A. Sefer
*Assistant Examiner* — Nikolay Yushin
(74) *Attorney, Agent, or Firm* — H.C. Park & Associates, PLC

(57) ABSTRACT

The present invention relates to a thin film transistor array panel and a manufacturing method thereof, and a thin film transistor array panel according to an exemplary embodiment of the present invention includes: a substrate; a first conductive layer disposed on the substrate; a second conductive layer overlapping at least a portion of the edge of the first conductive layer on the first conductive layer and including a first portion overlapping the first conductive layer and a second portion not overlapping the first conductive layer; a first insulating layer disposed on the second conductive layer and having a contact hole exposing at least a portion of a boundary between the first portion and the second portion; and a third conductive layer disposed on the first insulating layer and simultaneously contacting the first portion and the second portion that are exposed through the contact hole.

18 Claims, 10 Drawing Sheets

THIN FILM TRANSISTOR ARRAY PANEL AND MANUFACTURING METHOD THEREOF

CROSS REFERENCE TO RELATED APPLICATION

This application claims priority from and the benefit of Korean Patent Application No. 10-2011-0010743, filed on Feb. 7, 2011, which is hereby incorporated by reference for all purposes as if fully set forth herein.

BACKGROUND OF THE INVENTION

1. Field of the Invention

Exemplary embodiments of the present invention relate to a thin film transistor array panel and a manufacturing method thereof.

2. Discussion of the Background

A liquid crystal display, as one type of flat panel displays that are widely used, includes two display panels where field generating electrodes such as pixel electrodes and a common electrode are formed and a liquid crystal layer interposed between the two display panels. The liquid crystal display generates an electric field in a liquid crystal layer by applying voltages to the field generating electrodes to determine directions of liquid crystal molecules of the liquid crystal layer and control polarization of incident light, thereby displaying an image.

Each pixel electrode of the liquid crystal display may be connected to a corresponding switching element connected to signal lines such as a gate line and a data line. The switching element as a 3-terminal element such as a thin film transistor, transfers a data voltage through its output terminal to the pixel electrode. These switching elements and the plurality of signal lines are formed with several layers on a substrate, however when an underlying layer has a step difference, an overlying layer formed thereon may be disconnected.

The above information disclosed in this Background section is only for enhancement of understanding of the background of the invention and therefore it may contain information that does not form any part of the prior art.

SUMMARY OF THE INVENTION

Exemplary embodiments of the present invention provide a thin film transistor array panel that improves a disconnect due to a step difference of a wire.

Exemplary embodiments of the present invention also provide a method of manufacturing a thin film transistor array panel that improves a disconnect due to a step difference of a wire.

Additional features of the invention will be set forth in the description which follows, and in part will be apparent from the description, or may be learned by practice of the invention.

An exemplary embodiment of the present invention discloses a thin film transistor array panel including a first conductive layer disposed on a substrate. A second conductive layer is disposed on the first conductive layer and overlaps at least a portion of the edge of the first conductive layer. The second conductive layer includes a first portion overlapping the first conductive layer and a second portion not overlapping the first conductive layer. A first insulating layer is disposed on the second conductive layer, the first insulating layer has a contact hole exposing at least a portion of a boundary between the first portion and the second portion. A third conductive layer is disposed on the first insulating layer and simultaneously contacts the first portion and the second portion that are exposed through the contact hole.

An exemplary embodiment of the present invention also discloses a manufacturing method of a thin film transistor array panel that includes forming a first conductive layer on a substrate; forming a second conductive layer on the first conductive layer, the second conductive layer overlapping at least a portion of the edge of the first conductive layer and including a first portion overlapping the first conductive layer and a second portion not overlapping the first conductive layer. The method includes depositing a first insulating layer on the second conductive layer and forming a first contact hole in the first insulating layer, the first contact hole exposing at least a portion of a boundary between the first portion and the second portion; and forming a third conductive layer, on the first insulating layer. The third conductive layer is formed simultaneously contacting the first portion and the second portion that are exposed through the first contact hole on the first insulating layer.

In an exemplary embodiment of the present invention, when an underlying wire has a step difference, a contact hole exposing the step difference portion of the underlying wire is formed in the insulating layer disposed on the underlying wire, and when forming an overlying wire, an auxiliary electrode filling the contact hole is formed such that disconnection of the overlying wire due to the step difference of the underlying wire may be prevented and compensated, thereby reducing an increase of resistance.

It is to be understood that both the foregoing general description and the following detailed description are exemplary and explanatory and are intended to provide further explanation of the invention as claimed.

DETAILED DESCRIPTION OF THE ILLUSTRATED EMBODIMENTS

Figure 1:
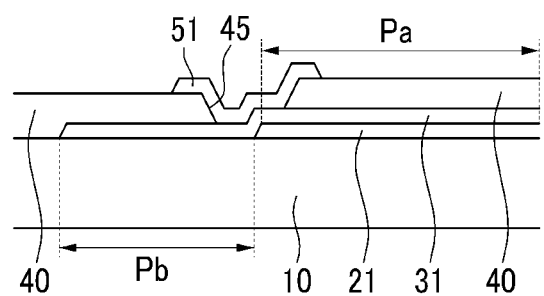
FIG. 1 and FIG. 2 are cross-sectional views of a thin film transistor array panel according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure is thorough, and will fully convey the scope of the invention to those skilled in the art.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" or "connected to" another element, it can be directly on or directly connected to the other element, or intervening elements may be present. In contrast, when an element is referred to as being "directly on" or "directly connected to" another element, there are no intervening elements present.

A thin film transistor array panel according to an exemplary embodiment of the present invention will be described with reference to FIG. 1 and FIG. 2.

Figure 2:
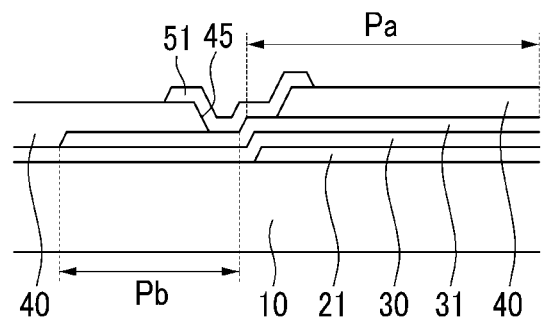

FIG. 1 and FIG. 2 are cross-sectional views of a thin film transistor array panel according to an exemplary embodiment of the present invention.

Referring to FIG. 1 and FIG. 2, a first conductive layer 21 is formed on an insulation substrate 10 made of transparent glass or plastic, and a second conductive layer 31 is formed thereof. The second conductive layer 31 overlaps at least a portion of the edge of the first conductive layer 21, and includes a first portion Pa overlapping a part of the first conductive layer 21 and a second portion Pb not overlapping the remaining part of the first conductive layer 21. Accordingly, the second conductive layer 31 has a step difference at the portion covering the edge of the first conductive layer 21, that is, the boundary of the first portion Pa and the second portion Pb. The step difference between the first portion Pa and the second portion Pb may be about equal to the height of the first conductive layer 21.

In the exemplary embodiment shown in FIG. 1, the second conductive layer 31 is deposited directly on the first conductive layer 21 such that it directly contacts the first conductive layer 21 and thereby directly receives signals, however, like the exemplary embodiment shown in FIG. 2, other layers may be formed such as an insulating layer 30 between the first conductive layer 21 and the second conductive layer 31. In this case, the second conductive layer 31 is electrically connected to the first conductive layer 21 through a contact hole (not shown) of the insulating layer 30, thereby receiving the signal.

The first conductive layer 21 and the second conductive layer 31 may be made of a conductive metal or a transparent conductive material such as indium tin oxide (ITO) and indium zinc oxide (IZO), and may have a multilayer structure.

An insulating layer 40 is formed on the first conductive layer 21 and the second conductive layer 31. The insulating layer 40 may be made of an inorganic insulator or an organic insulator. The insulating layer 40 has a contact hole 45 exposing a portion of the second conductive layer 31, particularly a step difference portion of the second conductive layer 21, and the first portion Pa and the second portion Pb adjacent thereto.

A third conductive layer 51 is formed on the insulating layer 40. The third conductive layer 51 is physically and electrically connected to the second conductive layer 31 through the contact hole 45. The third conductive layer 51 particularly contacts the step difference portion of the second conductive layer 31, that is, the boundary of the first portion Pa and the second portion Pb of the second conductive layer 31, and covers it such that disconnect of the second conductive layer 31 may be prevented. Also, the third conductive layer 51 simultaneously contacts the first portion Pa and the second portion Pb of the second conductive layer 31 such that the first portion Pa and the second portion Pb of the second conductive layer 31 are connected via the third conductive layer 51 even when the step difference portion of the second conductive layer 31 is disconnected, and thereby disconnect generated in the second conductive layer 31 may be compensated. The third conductive layer 51 may be made of the transparent conductive material such as ITO and IZO, or a conductive metal.

Next, a liquid crystal display according to an exemplary embodiment of the present invention will be described with reference to FIG. 3 and FIG. 4.

Figure 3:
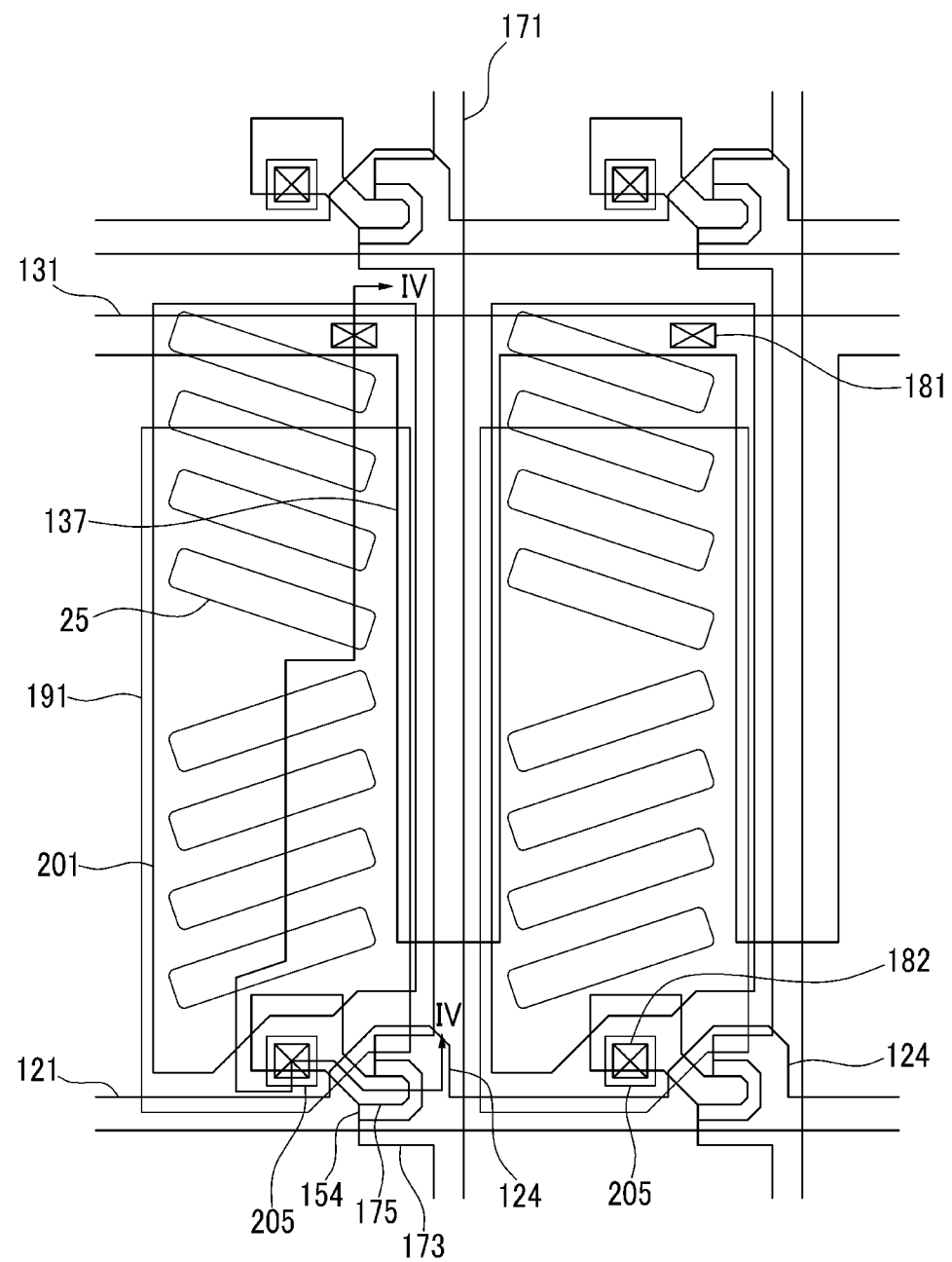
FIG. 3 is a layout view of two pixels of a liquid crystal display according to an exemplary embodiment of the present invention.
Figure 4:
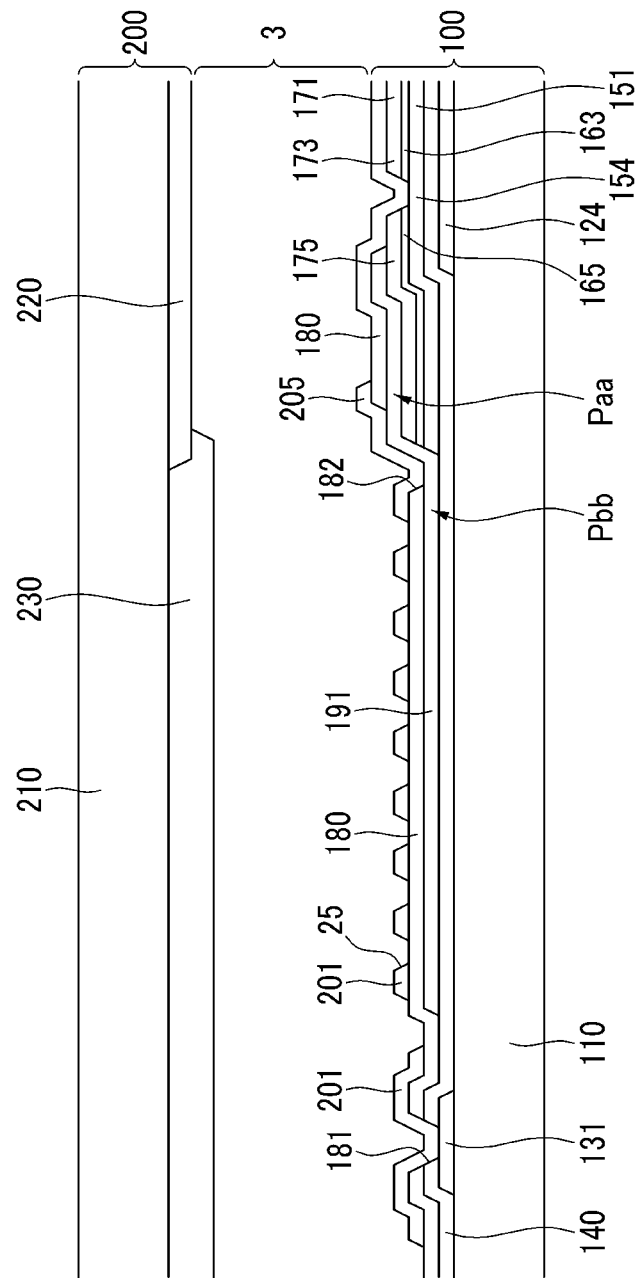
FIG. 4 is a cross-sectional view of the liquid crystal display of FIG. 3 taken along line IV-IV.

FIG. 3 is a layout view of two pixels of a liquid crystal display according to an exemplary embodiment of the present invention, and FIG. 4 is a cross-sectional view of the liquid crystal display of FIG. 3 taken along line IV-IV.

Referring to FIG. 3 and FIG. 4, a liquid crystal display according to the present exemplary embodiment includes a lower display panel 100 and an upper display panel 200 facing each other, and a liquid crystal layer 3 interposed between the two display panels 100 and 200.

The lower display panel 100 will be described with reference to FIG. 3 and FIG. 4.

A plurality of gate conductors including a plurality of gate lines 121 and a plurality of common voltage lines 131 are formed on an insulation substrate 110 made of transparent glass or plastic.

The gate lines 121 transmit gate signals and mainly extend in a transverse direction. Each gate line 121 includes a plurality of gate electrodes 124 protruding upward.

The common voltage lines 131 receive a predetermined voltage such as a common voltage Vcom and mainly extend in the transverse direction. Each common voltage line 131 includes a plurality of longitudinal portions 137 extending downward with a predetermined interval therebetween.

The gate conductors may be made of an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, a chromium-based metal of chromium (Cr) or chromium alloys, a tantalum-based metal of tantalum (Ta) or tantalum alloys, a titanium-based metal of titanium (Ti) or titanium alloys, or the like. However, each of the gate conductors may have a multilayered structure that includes two conductive layers (not shown) having different physical properties.

A gate insulating layer 140 formed of silicon nitride ($SiN_x$) or silicon oxide ($SiO_x$) is formed on the gate conductors.

A plurality of semiconductor stripes (not shown) made of hydrogenated amorphous silicon (simply referred to as a-Si) or polysilicon are formed on the gate insulating layer 140. Each semiconductor stripe extends in the longitudinal direction and includes a plurality of semiconductor protrusions 154 extending toward the gate electrode 124 therefrom.

A plurality of ohmic contact stripes 163 and a plurality of ohmic contact islands 165 are formed on the semiconductor stripes. The ohmic contact stripes 163 include a plurality of protrusions extending toward the gate electrodes 124, and the protrusions and the ohmic contact islands 165 form a pair while facing and spaced apart from each other with respect to the gate electrode 124 placed on the semiconductor protrusion 154. The ohmic contacts 163 and 165 may be made of a material such as n+ hydrogenated amorphous silicon doped with n-type impurities such as phosphorus at a high concentration, or of silicide.

A data conductor including a plurality of data lines 171 and a plurality of drain electrodes 175 is formed on the ohmic contacts 163 and 165.

The data lines 171 transmitting a data signal extend in the longitudinal direction and cross the gate lines 121 and the common voltage lines 131 while being insulated therefrom. Each data line 171 includes a plurality of source electrodes 173 extending toward the gate electrodes 124.

The drain electrodes 175 face and are spaced apart from corresponding source electrodes 173 with respect to the gate electrodes 124, and the drain electrodes 175 include one end of a bar type and the other end with a wide area.

The data conductors 171 and 175 may be made of a refractory metal such as molybdenum, chromium, tantalum, and titanium, or alloys thereof, and may have a multilayered structure including a refractory metal layer (not shown) and a low resistance conductive layer (not shown). Examples of the multilayered structure include a two-layer structure of a chromium or molybdenum (alloy) layer serving as a lower layer, and an aluminum (alloy) layer serving as an upper layer, and a three-layer structure of a molybdenum (alloy) layer serving as a lower layer, an aluminum (alloy) layer serving as an intermediate layer, and a molybdenum (alloy) layer serving as an upper layer.

The gate electrode 124, the source electrode 173, and the drain electrode 175 form a thin film transistor (TFT) along with the semiconductor protrusion 154, and a channel of the thin film transistor is formed in the semiconductor protrusion 154 between the source electrode 173 and the drain electrode 175.

The semiconductor 151 except for the semiconductor protrusion 154 of the thin film transistor has the same plane shape as that of the data line 171 and the drain electrode 175, and the underlying ohmic contacts 163 and 165.

A pixel electrode 191 is formed on the data conductors 171 and 175 and the exposed semiconductor protrusions 154.

The pixel electrode 191 covers at least a portion of the drain electrode 175 to directly contact the drain electrode 175. That is, the pixel electrode 191 includes a first portion Paa covering at least a portion of the edge of the drain electrode 175 and overlapping the drain electrode 175 to directly contact the drain electrode 175, and a second portion Pbb not overlapping the drain electrode 175. Accordingly, the pixel electrode 191 has a great step difference at the portion covering the drain electrode 175, that is, the boundary between the first portion Paa and the second portion Pbb. The step difference between the first portion Paa and the second portion Pbb of the pixel electrode 191 may be about equal to the sum of the heights of the semiconductor protrusion 154, the ohmic contact 165, and the drain electrode 175.

The pixel electrode 191 may be made of a transparent conductive material such as ITO and IZO. The pixel electrode 191 has four edges approximately parallel to the gate line 121 or the data line 171, and the corner of the portion where the thin film transistor is disposed is chamfered such that the pixel electrode 191 may be an approximate quadrangle, however it is not limited thereto. The pixel electrode 191 receives the data voltage from the drain electrode 175.

A passivation layer 180 is formed on the pixel electrode 191, the data conductors 171 and 175, and the exposed semiconductor protrusion 154. The passivation layer 180 may be made of the inorganic insulator. The passivation layer 180 has a contact hole 182 exposing a portion of the pixel electrode 191, and particularly the step difference portion of the pixel electrode 191 and the first portion Paa and the second portion Pbb near the step difference portion. The passivation layer 180 and the gate insulating layer 140 have a plurality of contact holes 181 exposing a portion of the common voltage line 131.

A plurality of common electrodes 201 and a plurality of auxiliary electrodes 205 are formed on the passivation layer 180. The common electrodes 201 and the auxiliary electrodes 205 may be made of a transparent conductive material such as ITO or IZO.

Each common electrode 201 has four edges approximately parallel to the gate lines 121 or the data lines 171, and the corner of the portion where the thin film transistor is disposed is chamfered such that it may be an approximate quadrangle, however it is not limited thereto. Also, the common electrode 201 has a plurality of cutouts 25. Each cutout 25 is extended in a direction forming an oblique angle with respect to the extending direction of the gate lines 121, and the plurality of cutouts 25 may be divided into two regions of which the extending directions of the cutouts are different. The cutouts 25 of the two regions with the different extending directions in FIG. 3 are reversely symmetrical with respect to an imagery transverse center line bisecting the common electrode 201.

The common electrode 201 receives a predetermined voltage such as a common voltage Vcom from the common voltage line 131 through the contact hole 181. The plurality of common electrodes 201 may be connected to each other. Also, the common electrodes 201 may mostly overlap the pixel electrodes 191.

The auxiliary electrode 205 with an island shape is separated from the common electrode 201. The auxiliary electrode 205 is physically and electrically connected to the pixel electrode 191 through the contact hole 182. The auxiliary electrode 205 particularly covers the step difference portion of the pixel electrode 191, at the boundary between the first portion Paa and the second portion Pbb, such that a disconnect or a crack that may be generated due to the high step difference at the step difference portion of the pixel electrode 191 may be prevented. Also, even if a crack is generated at the step difference portion of the pixel electrode 191, the first portion Paa and the second portion Pbb of the pixel electrode 191 are connected via the auxiliary electrode 205 such that the crack in the pixel electrode 191 may be compensated. Also, by forming the auxiliary electrodes 205 at the step difference portion of the pixel electrode 191, the pixel electrode 191 may have a layered structure of at least two layers such that the resistance of the pixel electrode 191 may be reduced.

On the other hand, the longitudinal portions 137 of the above-described common voltage line 131 overlap with respective portions of the lower panel near the data lines 171, overlapping with portions of the pixel electrodes 191, portions of adjacent pixel electrodes 191, or between the pixel electrodes 191, thereby blocking light leakage of the corresponding portions.

Referring to the upper panel 200, a light blocking member 220 and a color filter 230 are formed on an insulation substrate 210 made of transparent glass or plastic. The light blocking member 220 prevents light leakage between the pixel electrodes 191 and defines an opening area facing the pixel electrodes 191. The color filter 230 exists in the area surrounded by the light blocking member 220, and may extend long along a column direction of the pixel electrode 191. Each color filter 230 may display one of primary colors such as three primary colors of red, green, and blue, or the like.

The liquid crystal layer 3 interposed between the lower display panel 100 and the upper display panel 200 includes liquid crystal molecules (not shown), wherein the liquid crystal molecules may be aligned so that a major axis thereof is formed to be horizontal with respect to the surfaces of the two display panels 100 and 200 in the state where an electric field is not present.

The pixel electrode 191 applied with the data voltage generates an electric field in the liquid crystal layer 3 together with the common electrode 201 applied with the common voltage Vcom, thereby determining the direction of the liquid crystal molecules of the liquid crystal layer 3. Particularly, the edge of the cutouts 25 of the common electrode 201 distorts the electric field to generate horizontal components of the electric field of various directions such that the arrangement directions of the liquid crystal molecules may be varied, thereby obtaining a wide viewing angle.

A manufacturing process of a thin film transistor array panel shown in FIG. 3 and FIG. 4 according to an exemplary embodiment of the present invention will now be described with reference to FIG. 5, FIG. 6, FIG. 7, FIG. 8, FIG. 9, FIG. 10 and FIG. 11.

FIGS. 5 to 11 are cross-sectional views sequentially showing intermediate step differences in a manufacturing process of a thin film transistor array panel shown in FIG. 3 and FIG. 4 according to an exemplary embodiment of the present invention.

Figure 5:
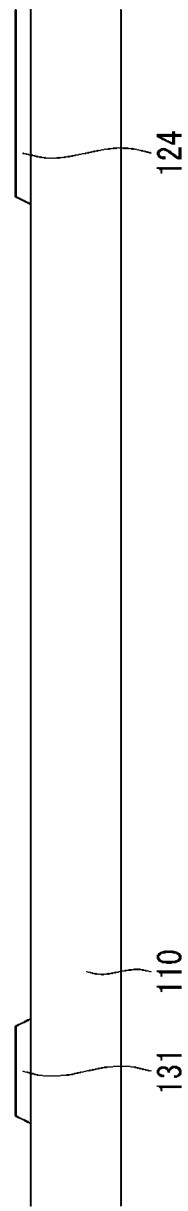
FIG. 5, FIG. 6, FIG. 7, FIG. 8, FIG. 9, FIG. 10 and FIG. 11 are cross-sectional views sequentially showing intermediate step differences in a manufacturing process of a thin film transistor array panel shown in FIG. 3 and FIG. 4 according to an exemplary embodiment of the present invention.

Referring to FIG. 5, a plurality of gate conductors including a plurality of gate lines 121 having gate electrodes 124 and a plurality of common voltage lines 131 are formed on an insulation substrate 110 made of transparent glass.

Figure 6:
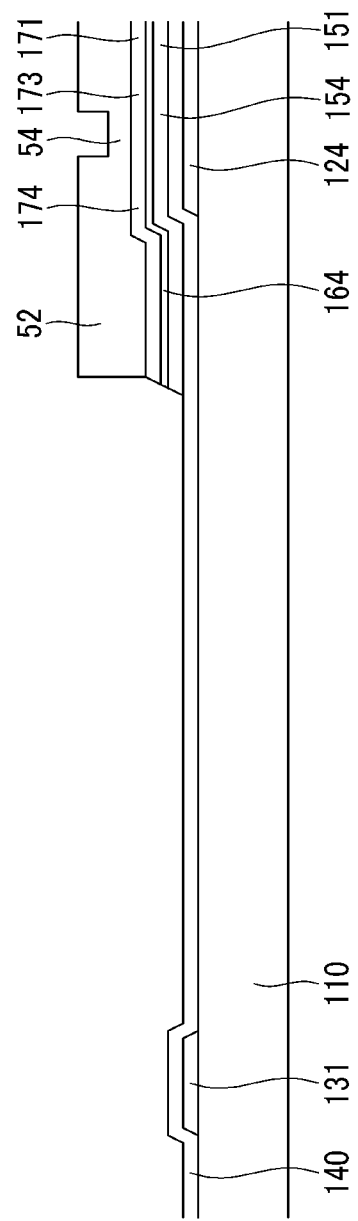

Next, referring to FIG. 6, a gate insulating layer 140 is deposited on the gate conductors. A semiconductor layer (not shown) and a semiconductor layer doped with an impurity (not shown) are sequentially deposited by chemical vapor deposition on the gate insulating layer 140. Next, a data conductive layer (not shown) is deposited by sputtering, and a photoresist is exposed to form a photosensitive film pattern. The photosensitive film pattern may include a thin portion 54 that is disposed on the gate electrode 124 and a remaining thick portion 52. Next, the data conductive layer, the doped semiconductor layer, and the semiconductor layer are etched by using the photosensitive film pattern as an etching mask to form a plurality of data conductors 174, a plurality of ohmic contact layers 164, and a semiconductor including a plurality of semiconductor protrusions 154 having the same plane shape.

Figure 7:
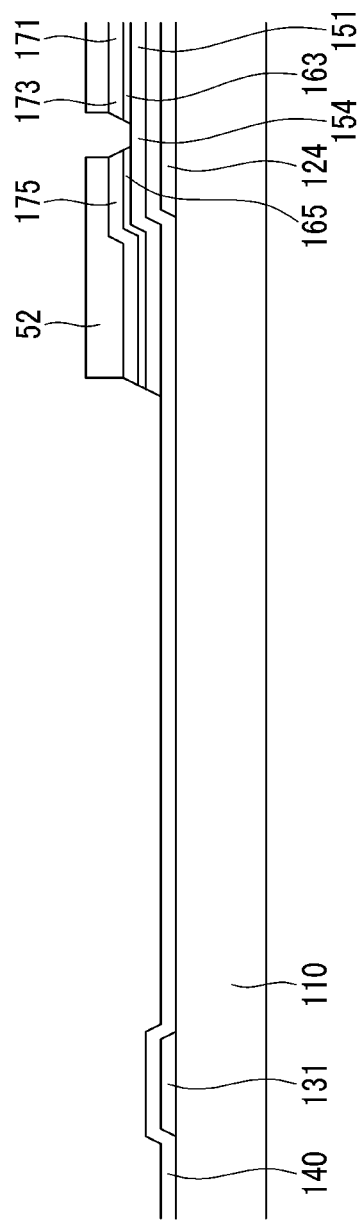

Next, referring to FIG. 7, the thin portion 54 of the photosensitive film pattern is removed and then the exposed data conductor 174 and ohmic contact layer 164 are etched to form the channel of the thin film transistor and to form a plurality of data lines 171 including source electrodes 173, a plurality of drain electrodes 175, and ohmic contacts 163 and 165. Next, the remaining photosensitive film 52 is removed.

Figure 8:
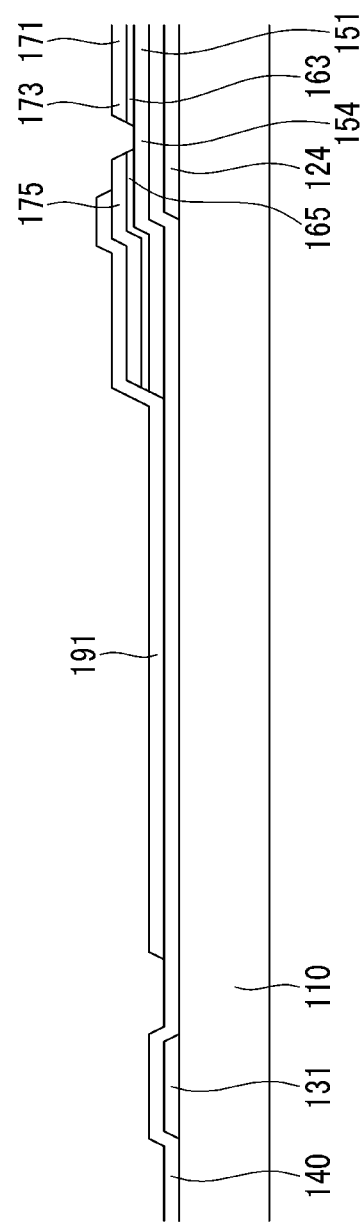

Next, referring to FIG. 8, the transparent conductive material of ITO or IZO is deposited and etched to form a plurality of pixel electrodes 191 directly contacting corresponding drain electrodes 175.

Figure 9:
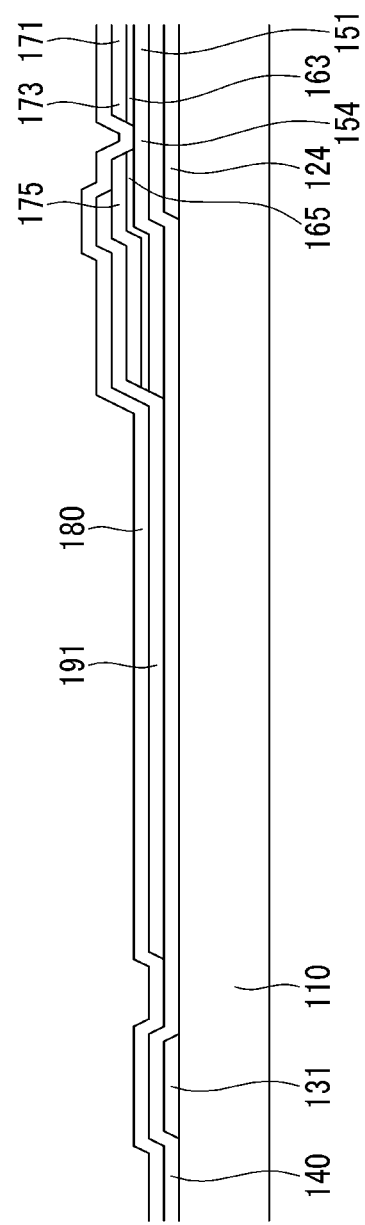

Next, referring to FIG. 9, an inorganic insulating material is coated or deposited on the gate insulating layer 140 and the pixel electrode 191 to form a passivation layer 180.

Figure 10:
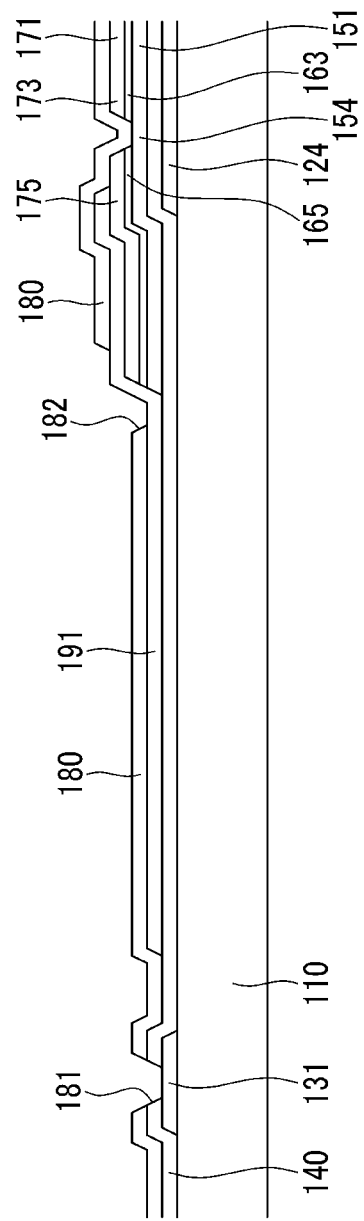

Referring to FIG. 10, the passivation layer 180 and the gate insulating layer 140 are etched together to form a plurality of contact holes 181 and 182.

Figure 11:
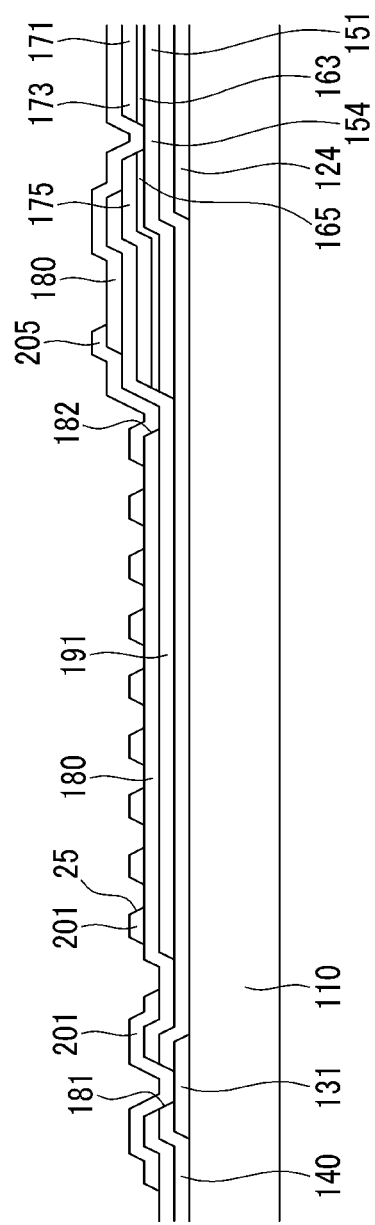

Referring to FIG. 11, a conductive material of IZO or ITO is deposited and patterned on the passivation layer 180 to form a plurality of common electrodes 201 including cutouts 25 and a plurality of auxiliary electrodes 205.

According to an exemplary embodiment of the present invention, while manufacturing the lower panel of the liquid crystal display by using a minimum number of masks (e.g., 5), deterioration due to the step difference may be improved such that the manufacturing cost and time may be reduced.

In an exemplary embodiment of the present invention, when an underlying wire has a step difference, a contact hole exposing the step difference portion of the underlying wire is formed in the insulating layer formed on the underlying wire, and when forming an overlying wire, an auxiliary electrode filling the contact hole is simultaneously formed such that disconnection of the underlying wire due to the step difference may be prevented or compensated, thereby reducing the resistance of the underlying wire. This may be applied to various elements having a plurality of deposition structure as well as the thin film transistor array panel of the liquid crystal display.

While this invention has been described in connection with what is presently considered to be practical exemplary embodiments, it will be apparent to those skilled in the art that the invention is not limited to the disclosed exemplary embodiments, but, on the contrary, is intended to cover various modifications and equivalent arrangements that can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel, comprising:
   a substrate;
   a first conductive layer disposed on the substrate and comprising a drain electrode;
   a second conductive layer disposed on the first conductive layer and comprising a first portion that overlaps the drain electrode and a second portion that does not overlap the drain electrode;
   a first insulating layer disposed on the second conductive layer, the first insulating layer comprising a contact hole exposing at least a portion of a boundary between the first portion and the second portion; and
   a third conductive layer disposed on the first insulating layer and contacting the first portion and the second portion through the contact hole.

2. The thin film transistor array panel of claim 1, wherein the third conductive layer covers the boundary between the first portion and the second portion.

3. The thin film transistor array panel of claim 2, wherein the first portion of the second conductive layer directly contacts the drain electrode.

4. The thin film transistor array panel of claim 3, further comprising a common electrode disposed on the first insulating layer and comprising a cutout, wherein,
   the second conductive layer comprises a pixel electrode, and
   the common electrode and the third conductive layer are formed from the same layer.

5. The thin film transistor array panel of claim 4, further comprising a common voltage line disposed under the drain electrode,
   wherein the common electrode is connected to the common voltage line to receive a common voltage Vcom.

6. The thin film transistor array panel of claim 1, wherein the first portion of the second conductive layer directly contacts the drain electrode.

7. The thin film transistor array panel of claim 6, further comprising a common electrode disposed on the first insulating layer and comprising a cutout, wherein,
   the second conductive layer comprises a pixel electrode, and
   the common electrode and the third conductive layer are formed from the same layer.

8. The thin film transistor array panel of claim 7, further comprising a common voltage line disposed under the drain electrode, and
   wherein the common electrode is connected to the common voltage line to receive a common voltage Vcom.

9. A method for manufacturing a thin film transistor array panel, the method comprising:

forming a first conductive layer on a substrate and comprising a drain electrode;

forming a second conductive layer on the first conductive layer, the second conductive layer comprising a first portion that overlaps the drain electrode and a second portion that does not overlap the drain electrode;

depositing a first insulating layer on the second conductive layer and forming a first contact hole in the first insulating layer, the first contact hole exposing at least a portion of a boundary between the first portion and the second portion; and forming a third conductive layer on the first insulating layer, the third conductive layer contacting the first portion and the second portion through the first contact hole.

10. The method of claim 9, wherein the third conductive layer covers the boundary between the first portion and the second portion.

11. The method of claim 10, wherein the first portion of the second conductive layer directly contacts the drain electrode.

12. The method of claim 11, further comprising forming a common electrode on the first insulating layer, the common electrode comprising a cutout,
wherein the common electrode and the third conductive layer are simultaneously formed from the same layer.

13. The method of claim 12, further comprising:
forming a gate line and a common voltage line on the substrate;
forming a second insulating layer on the gate line and the common voltage line; and
forming a second contact hole in the first insulating layer and the second insulating layer, the second contact hole exposing a portion of the common voltage line,
wherein the common electrode is connected to the common voltage line through the second contact hole.

14. The method of claim 9, wherein the first portion of the second conductive layer directly contacts the drain electrode.

15. The method of claim 14, further comprising forming a common electrode comprising a cutout on the first insulating layer,
wherein the common electrode and the third conductive layer are simultaneously formed from the same layer.

16. The method of claim 15, further comprising:
forming a gate line and a common voltage line on the substrate;
forming a second insulating layer on the gate line and the common voltage line; and
forming a second contact hole in the first insulating layer and the second insulating layer, the second contact hole exposing a portion of the common voltage line,
wherein the common electrode is connected to the common voltage line through the second contact hole.

17. A thin film transistor array panel, comprising:
a conductive layer disposed on a substrate, the conductive layer comprising a step difference at a boundary between a first portion of the conductive layer and a second portion of the conductive layer;
an insulating layer disposed on the conductive layer, the insulating layer comprising a contact hole exposing at least a portion of the boundary between the first portion and the second portion; and
an auxiliary conductive layer disposed on the insulating layer as an island, the auxiliary conductive layer contacting the first portion and the second portion through the contact hole and covering the boundary between the first portion and the second portion.

18. The thin film transistor array panel of claim 17, further comprising
an underlying conductive layer disposed under the first portion but not under the second portion,
wherein the underlying conductive layer contacts the first portion.

* * * * *